United States Patent [19]

Sato et al.

[11] Patent Number: 5,290,712

[45] Date of Patent: Mar. 1, 1994

[54] PROCESS FOR FORMING CRYSTALLINE SEMICONDUCTOR FILM

[75] Inventors: Nobuhiko Sato; Takao Yonehara, both of Atsugi; Hideya Kumomi, Tokyo, all of Japan

[73] Assignee: Canon Kabushiki Kaisha, Tokyo, Japan

[21] Appl. No.: 790,083

[22] Filed: Nov. 13, 1991

Related U.S. Application Data

[63] Continuation of Ser. No. 501,485, Mar. 30, 1990, abandoned.

[30] Foreign Application Priority Data

Mar. 31, 1989 [JP] Japan ................................. 1-81103
Apr. 28, 1989 [JP] Japan ................................ 1-110386

[51] Int. Cl.$^5$ ............................................ H01L 21/20
[52] U.S. Cl. ..................................... 437/24; 437/233; 437/108; 156/603
[58] Field of Search ......................... 437/24, 233, 108; 156/603, 605

[56] References Cited

U.S. PATENT DOCUMENTS

| | | | |
|---|---|---|---|
| 3,589,949 | 6/1971 | Nelson | 437/24 |
| 3,900,345 | 8/1975 | Lesk | 437/24 |
| 4,177,084 | 12/1979 | Lau et al. | 437/24 |
| 4,385,937 | 5/1983 | Ohmura | 437/24 |
| 4,463,492 | 8/1984 | Maeguchi | 437/24 |
| 4,800,527 | 1/1989 | Ozaki et al. | 365/182 |
| 4,863,877 | 9/1989 | Fan et al. | 156/603 |
| 4,868,140 | 9/1989 | Yonehara | 437/109 |
| 4,904,611 | 2/1990 | Chiang et al. | 437/24 |

FOREIGN PATENT DOCUMENTS

| | | |
|---|---|---|
| 0308166 | 3/1989 | European Pat. Off. . |
| 55-67131 | 5/1980 | Japan .................................... 437/24 |
| 63-253616 | 10/1980 | Japan . |
| 57-159017 | 10/1982 | Japan .................................... 437/24 |
| 58-56406 | 4/1983 | Japan . |
| 63-137412 | 6/1988 | Japan .................................... 437/24 |

OTHER PUBLICATIONS

Kwizera, P., "Solid Phase Epitaxial . . . Implantation", Applied Physics Letters 41(4) Aug. 1982 pp. 379–381.
T. Noguchi, et al., Materials Research Society Symposium Proceedings, vol. 106, Polysilicon Films and Interfaces, pp. 293–304 (Elsevier Science Publishing, New York 1988).
Patent Abstracts of Japan, vol. 7, No. 178 (E-191) [1323], Aug. 6, 1983.
Patent Abstracts of Japan, vol. 8, No. 4 (E-220) [1441], Jan. 10, 1984.

Primary Examiner—George Fourson
Attorney, Agent, or Firm—Fitzpatrick, Cella, Harper & Scinto

[57] ABSTRACT

A process for forming a crystalline semiconductor film by crystallization through solid phase growth of an amorphous semiconductor film on a base material comprises implanting ions of an element constituting the amorphous semiconductor film into the amorphous semiconductor film except a fine region therein, then heat-treating the amorphous semiconductor film at a temperature not higher than the melting point of the amorphous semiconductor film, thereby generating a crystal nucleus in the fine region, and making a crystal grow at the crystal nucleus as growth point.

10 Claims, 6 Drawing Sheets

PROCESS FOR FORMING CRYSTALLINE SEMICONDUCTOR FILM

This application is a continuation of application Ser. No. 07/501,485 filed Mar. 30, 1990, now abandoned.

BACKGROUND OF THE INVENTION

1. Field of the Invention

This invention relates to a process for forming a crystalline semiconductor film and more particularly to a process for forming semiconductor film with large grain sizes and controlled grain boundary position, capable of forming semiconductor devices such as a thin film transistor (TFT) of high performance.

2. Related Background Art

Heretofore, a process for solid phase growth of a crystalline film by annealing an amorphous thin film formed in advance on a substrate at a lower temperature than the melting point has been proposed as one of processes in the field of crystal formation technology to make a crystalline film grow on a substrate such as an amorphous substrate. For example, a process for formation of crystal by annealing an amorphous Si film having thickness of about 100 nm formed on the surface of amorphous $SiO_2$ in a $N_2$ atmosphere at 600° C., thereby crystallizing the amorphous Si thin film to obtain a polycrystalline film having grain sizes of about 5 pm is reported [T. Noguchi, H. Hayashi and H. Ohshima, 1987, Mat. Res. Soc. Symp. Proc., 106, Polysilicon and Interfaces, 293, (Elsevier Science Publishing, New York 1988)]. Since the surface of the polycrystalline film obtained by the process remains flat, it is possible to form electronic devices such as MOS transistors or diodes thereon. Furthermore, the average grain sizes of the polycrystalline film are larger than those of ordinary polycrystalline film obtained by LPCVD process, thus the devices formed with the polycrystalline film have a relatively high performance.

However, the polycrystalline film obtained by the above-mentioned process for formation of crystal has relatively large crystal grain sizes, but the distribution of grain sizes and the position of crystal grain boundary are not controlled, because the crystallization of amorphous Si film is based on solid phase growth of crystal nuclei generated at random in the amorphous Si film by the annealing in that case. That is, generation of crystal nuclei at random leads to random positioning of grain boundary, resulting in distribution of grain sizes in a broad range. In spite of merely large average crystal grain size, the above-mentioned process still has the following problems.

For example, in the case of MOS transistors, generally the gate size is as large as or less than the average crystal grain size and thus the gate region has a part containing no grain boundary and a part containing a few crystal grains. Electrical characteristics naturally change between the part containing no grain boundary and the part containing a few crystal grains. Thus, a large fluctuation develops in the characteristics between a plurality of devices, and when an integrated circuit or the like is to be formed, the fluctuation in the crystal grain size has been a considerable bar to the improvement of integrated circuit performance.

As to the fluctuation in the grain size among the problems encountered in the polycrystalline film of large grain size by the solid phase crystallization, a process for controlling it is proposed in Japanese Patent Application Kokai (Laid-Open) No. 58-56406, as will be explained below, referring is FIG. 9. As shown in FIG. 9A, an amorphous Si film 42 is formed on a substrate 41 of Si single crystal having a heat oxidation film on the surface. Then, thin film pieces 44 of a different material from that of the amorphous Si film 42, for example, $SiO_2$, are periodically provided on the amorphous Si film. Then, the entire substrate is annealed in an ordinary heating furnace, whereby crystal nuclei 43 are preferentially formed at positions of amorphous Si film 42 in contact with the peripheral parts of thin film pieces 44. By making the crystal nuclei further grow, the amorphous Si film 42 is crystallized throughout the entire area, and a polycrystalline film composed of a group of crystal grains 45 with larger grain size, as shown in FIG. 9B can be obtained.

However, it is the current situation that the positions of crystal grain boundaries are not satisfactorily controlled even by the above-mentioned process, because in the above-mentioned process preferential formation of nuclei takes place at the peripheral parts of the thin film pieces 44 due to local effect of elastic energy at positions of amorphous Si film 42 in contact with the peripheral parts of the film pieces 44. Consequently, a plurality of nuclei generate along the peripheral parts, but it is difficult to control the number of nuclei.

Furthermore, in order to obtain a polycrystalline film in the above-mentioned process, annealing is carried out after the thin film pieces 44 of a different material from that of amorphous Si film 42 are brought into contact with the amorphous Si film 42, and this procedure sometimes leads to contamination of polycrystalline film with the constituent element of thin film pieces 44 as an impurity, which is a problem in the production of a polycrystalline film of high quality.

Control of positions for formation of nuclei in the solid phase growth of amorphous Si film is also proposed in Japanese Patent Application Kokai (Laid-Open) No. 63-253616, as will be explained below, referring to FIG. 10. $N^+$ ions 53 are locally implanted in an amorphous Si thin film 52 on an insulating substrate 51 to form ion-implanted regions 54. Then, crystal nuclei are preferentially generated in other region than the ion-implanted regions 54, that is, region 52, by annealing.

However, in the above-mentioned process, the annealing is carried out after a different material from the amorphous Si, that is $N^+$ ions, has been implanted, and thus N atoms sometimes remain in the crystalline Si as an impurity. In that case, N atoms act as an electrically active impurity and sometimes inhibit formation of devices of high performance.

SUMMARY OF THE INVENTION

A main object of the present invention is to provide a process for forming a crystalline semiconductor film having solved the problems of the above-mentioned prior art.

Another object of the present invention is to provide a process for forming a crystalline semiconductor film with controlled positions of grain boundaries by controlling the positions for formation of nuclei in the solid phase.

Further object of the present invention is to provide a process for forming a crystalline semiconductor film suppressing inclusion of unnecessary impurity into the crystalline semiconductor film.

DESCRIPTION OF THE PREFERRED EMBODIMENTS

Figure 1:
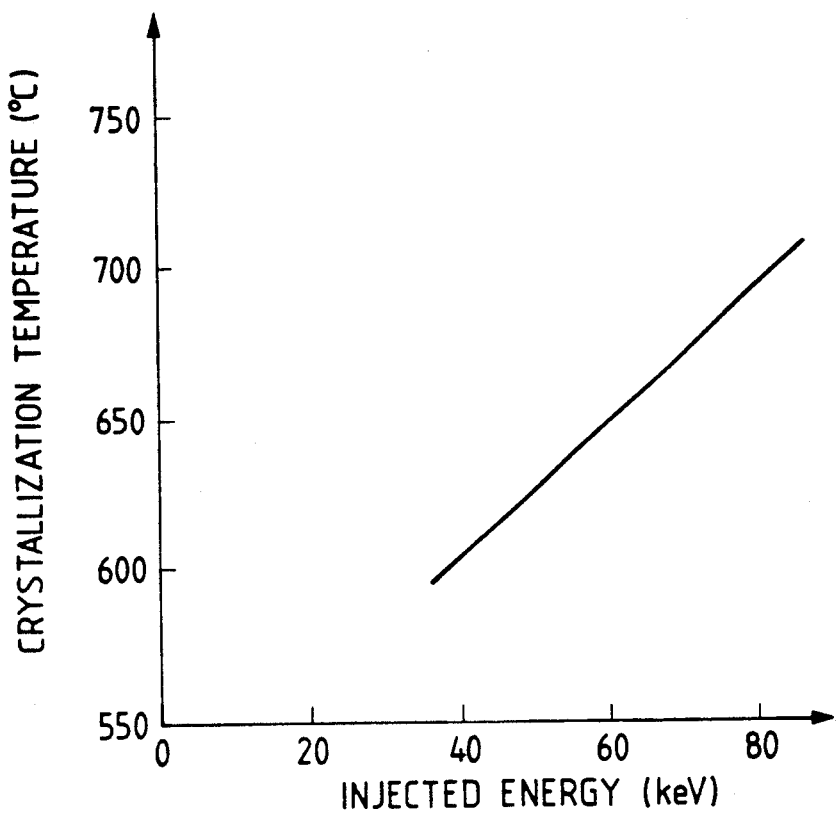
FIG. 1 is a diagram showing a relationship between an ion-implantation energy and a crystallization temperature.

The present invention has been established on the basis of results of extensive experimental studies on the solid phase growth of crystalline semiconductor films in the aforementioned situations as background.

Preferable aspects of a process for forming a crystalline semiconductor film according to the present invention are as follows:

The present invention is to provide a process for forming a crystalline semiconductor film by crystallization through solid phase growth of an amorphous semiconductor film on a base material which comprises implanting ions of an element constituting the amorphous semiconductor film into the amorphous semiconductor film except for a fine region therein, then heat-treating the amorphous semiconductor film at a temperature not higher than the melting point of the amorphous semiconductor film, thereby generating a crystal nucleus in the fine region, and making a crystal grow at the crystal nucleus as growth point.

According to a first aspect of the present invention, a process for forming a crystalline semiconductor film by crystallization through solid phase growth of an amorphous semiconductor film on an base material is provided, which comprises implanting ions of an element constituting the amorphous semiconductor film into the amorphous semiconductor film such that a fine region having a lower degree of implantation damage than that in another remaining region is formed at a position near the boundary between the amorphous semiconductor film and the base material, then heat-treating the amorphous semiconductor film at a temperature not higher than the melting point of the amorphous semiconductor film, thereby preferentially generating a crystal nucleus from the fine region, and making a crystal grow at the crystal nucleus as growth point.

According to a second aspect of the present invention, a process for forming a crystalline semiconductor film is provided, which comprises providing a region fine enough to form only a single crystal-nucleus by heat treatment at a desired position of an amorphous semiconductor film provided on a base material, implanting ions of an element constituting the amorphous semiconductor film into the amorphous semiconductor film except the region, then carrying out a first heat-treatment of the amorphous semiconductor film at a first temperature not higher than the melting point of the amorphous semiconductor film, thereby forming only a single crystal-nucleus in the fine region, and carrying out a second heat treatment of the amorphous semiconductor film at a second temperature lower than the first temperature, thereby making a crystal grow at the nucleus as growth point.

According to the present invention, there can be obtained a crystalline semiconductor film the positions of grain boundaries of which are controlled and which has a desired grain size. When a device is formed with the present crystalline semiconductor film, it is possible to form an integrated circuit with good characteristics without any fluctuation even if the number of devices is much larger than the number of devices so far used.

Furthermore, according to the present invention, a flat semiconductor film having a larger grain size can be formed without a polishing step or the like, and thus the process steps for forming a device can be considerably simplified.

Still furthermore, according the present invention, inclusion of impurities into the crystalline semiconductor film can be suppressed to a maximum, and a device of very high performance can be formed with the present crystalline semiconductor film.

The function and structure of the present invention will be explained in detail below together with findings obtained when the present invention was accomplished.

The point of the present invention is how to control the crystal growth positions in an amorphous solid phase, that is, how to preferentially generate nuclei of crystals at specific positions in an amorphous semiconductor film and suppress generation of nuclei in other regions.

At first, the first aspect of the present invention will be described below.

In deposition of a polycrystalline Si film on a base material composed of e.g. $SiO_2$, followed by implantation of Si ions into the film to make the polycrystalline Si film amorphous, and successive heat treatment of the film, the present inventors have found such phenomenon that the temperature for generating crystal nuclei (crystallization temperature) highly depends on the ion implantation energy.

Thus, the present inventors tried to clarify why the temperature for generating crystal nuclei depends on the ion implantation energy, and found the following facts, as will be explained in detail below.

When the ion implantation energy is changed, distribution of implanted Si ions is changed in the Si layer brought into an amorphous state (amorphous Si layer), and consequently distribution of formed holes, that is, distribution of regions having implantation damages, is changed in the film thickness direction, depending on the level of ion implantation energy.

Furthermore, in the amorphous material, nuclei of crystals are formed by overcoming an increase in the surface energy required for generating critical nuclei, and then phase transition of Si atoms from the amorphous phase to the crystalline phase takes place.

Formation of nuclei of crystals includes homogeneous nucleus formation and heterogeneous nucleus formation. The former means formation of nuclei in a homogeneous material (for example in an amorphous Si film), and the formation of nuclei depends mainly on whether or not nuclei of crystals can be formed by overcoming an increase in the surface energy required for generating critical nuclei. On the other hand, in the latter heterogeneous nucleus formation, generation of nuclei is initiated by contact with foreign matters, and its activation energy is lower in the case of the latter than in the case of the former. That is, the heterogeneous formation takes place more easily than the homogeneous nucleus formation. The nucleus formation in an amorphous Si film is rate-determined mainly by the heterogeneous nucleus formation at positions near the boundary to the base material (substrate).

The present inventors have found that the depth to which the ion implantation dose becomes maximum (projection range) has an important influence upon the heterogeneous nucleus formation at the above-mentioned boundary even under the condition of constant ion implantation dose.

FIG. 1 is a diagram showing a correlation between an ion implantation energy and a crystallization temperature, obtained under the following test conditions.

A polycrystalline Si film having a thickness of 100 nm was formed on a $SiO_2$ substrate at 620° C. by a reduced pressure CVD method, using $SiH_4$ as a raw material gas. $Si^+$ ions were implanted into the polycrystalline Si film. The implantation dose was set constant over the critical dose (about $10^{15}$ cm$^{-2}$) that makes the entire crystalline phase completely amorphous (i.e. $5 \times 10^{15}$ cm$^{-2}$ in this case). The implantation energy was changed from 40 key to 80 key. The Si atoms in the ion-implanted layer were knocked on from the lattice positions by ion impingement and the damaged regions were made continuous by the implantation over the critical dose, whereby the polycrystalline Si film was made amorphous. The thus obtained amorphous Si film was heat-treated in a $N_2$ atmosphere at various temperatures for 20 hours, and the recrystallization process in the solid phase was observed mainly by a transmission-type electron microscope to investigate crystallization temperatures under the above-mentioned condition.

Implantation energy of 40 key and that of 70 key will be examined below. The implantation depths (projection ranges) at 40 key and 70 key are 55.2 nm and 99.7 nm, respectively, which correspond to the level near the middle of film thickness and the level near the boundary to the base material, respectively, in the film having a film thickness of 100 nm. As shown in FIG. 1, their crystallization temperatures have a difference of more than 50° C. and it is obvious therefrom that the ion implantation down to the level near the boundary to the base material makes the crystallization temperature higher, that is, the crystallization is harder to take place, because it seems that the damaged regions by implanted ions extend larger to the level near the boundary and as a result the formation of heterogeneous nuclei is inhibited thereby. Furthermore, when a film made amorphous by effecting implantation at 40 keV such that the projection range extended near the middle of film thickness and a film made amorphous by effecting implantation at 70 keV such that the depth of implantation extended near the boundary are heat-treated, at such a temperature at which an amorphous film deposited by CVD was crystallized within one hour (e.g. 600° C.), it has been found by observation by a transmission-type electron microscope that the films were not crystallized even after 100 hours.

Figure 2:
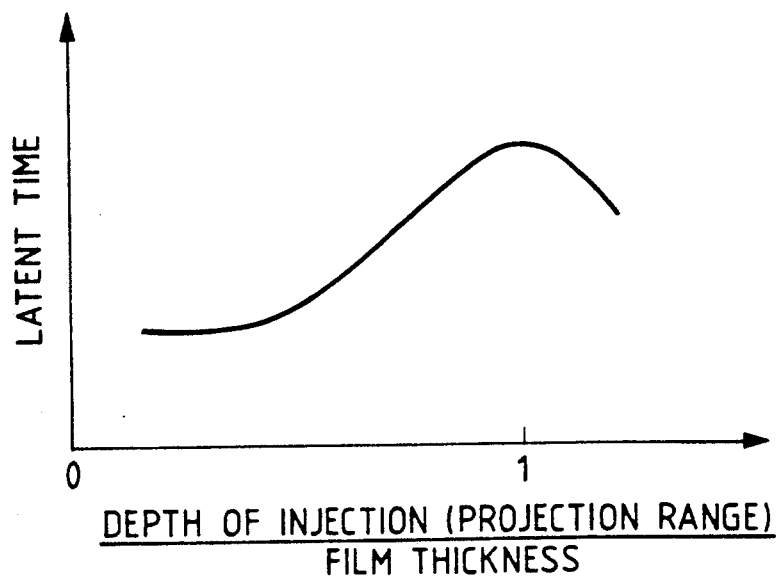
FIG. 2 is a diagram showing a relationship between a projection range and a latent time.

A relationship between a time from the start of heat treatment to the start of crystallization (latent time) and an ion implantation depth is shown in FIG. 2. As shown in FIG. 2, the deeper the ion implantation depth towards the boundary to the base material, the longer the latent time and the harder the crystallization. A level of (projection range)/(film thickness)=1, that is, a level near the boundary is a position most susceptible to damages, where the latent time is the longest and has a maximum point.

It is apparent from the foregoing that a difference is brought about in the crystallization temperature and the latent time by changing the implantation energy. This is assumed to be due to the inhibition of formation of heterogeneous nuclei at the level near the boundary.

In the present invention, the positions of forming nuclei are controlled by utilizing the above-mentioned phenomena.

Figure 3A:
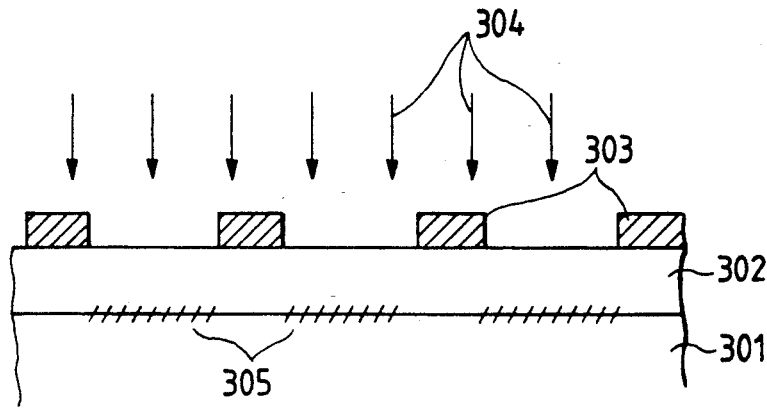
FIGS. 3A to 3C show process steps according to one embodiment of the present invention.

As shown in FIG. 3A, masks 303 such as resists or the like are provided on the surface of an amorphous Si film 302 provided on a substrate 301 to cover the regions subject to generation of nuclei, and Si ions 304 are implanted only into the regions not subject to generation of nuclei upon selection of an appropriate implantation energy so that the positions near the boundary of amorphous Si film 302 to the base substrate 301 can be damaged thereby.

Figure 3B:
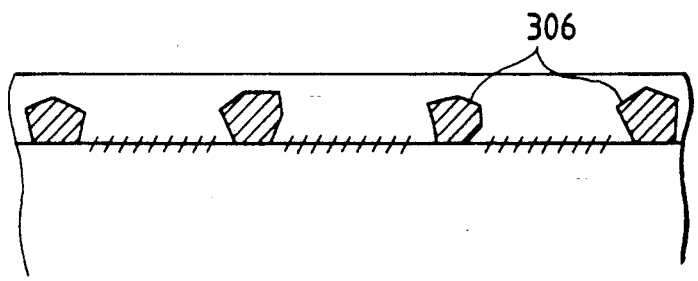
Figure 3C:
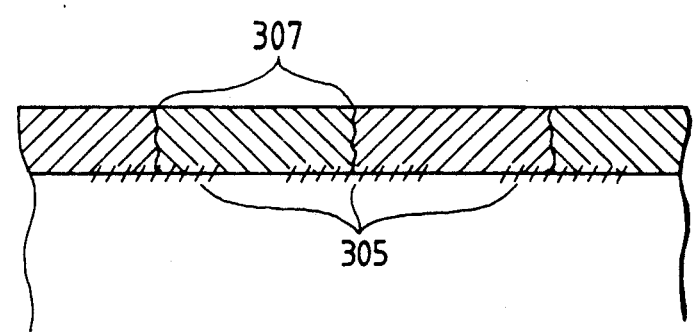

Implantation damages are given mainly to the positions near the boundary of the regions not covered by the resist masks 303, and the generation of nuclei is inhibited during the successive heat treatment. Then, a crystallization temperature and a crystallization time for crystallizing the regions with a low degree of implantation damages or without any implantation damages (hereinafter referred to as "non-damaged boundary region") without crystallizing the regions with a high degree of implantation damages (hereinafter referred to as "damaged boundary regions") are selected from FIGS. 1 and 2, and the amorphous Si film 302 with the Si ion-implanted regions at the boundary to the substrate 302 is heat treated in $N_2$ or $H_2$. By the heat treatment, nuclei are locally generated. For the amorphous Si layer, heat treatment conditions are typically about 630° C. for about 100 hours, generally 500° to 650° C. for 5 to 100 hours, and more preferably 575° to 625° C. for 7 to 50 hours. When the size of the non-damaged boundary regions is a finely small area (an area of not more than 5 μm in diameter, preferably not more than 2 μm is diameter and more preferebly not more than 1 μm in diameter), crystal nuclei generate in the finely small areas early by initiation of the heat treatment and single crystals 306 grow (FIG. 3B). By continuing the heat treatment, the crystalline phase having such a single domain extends outwards, and the boundary between the amorphous phase and the crystalline phase diffuses through the amorphous phase to take Si atoms into the crystalline phase. In this manner the size of crystal increases continuously and a phase transition from the amorphous phase to the crystalline phase takes place with a lower energy than the surface energy required for formation of nuclei. Thus, the amorphous phase is taken into the single crystalline phase generated in the non-damaged boundary regions before the formation of nuclei in the damaged boundary regions, and ultimately the adjacent crystals themselves impinge on one another to form crystal grain boundaries 307 there (FIG. 3C).

At that time the grain size of the resulting crystal grains is substantially equal to the distance between the non-damaged boundary regions, and the crystal grain size and also the positions of grain boundaries 307 can be selected as desired.

In the present invention, the term "base material" means not only a substrate on which a deposition film is formed, but also means a deposition film formed on the substrate.

In the present invention, the amorphous film is not restricted to an amorphous film formed by making a polycrystalline film amorphous by ion implantation into the polycrystalline film, but includes a film having an amorphous structure formed during the deposition of the film.

When a starting material is a polycrystalline film, a first ion implantation is carried out, without providing masks, so that the projection range can reach the level near the middle of the film thickness of the polycrystalline film. By the first ion implantation, the polycrystalline film can be made amorphous without giving ion implantation damages to the positions near the boundary of the polycrystalline film to the base material. Then, a second ion implantation is carried out at parts corresponding to the finely small regions in a masked state, for example, by resists or the like, so that the projection range can reach the position near the boundary of the amorphous film to the base material. By the second ion implantation, ion implantation damages are given to the positions near the boundary of the amorphous film to the base material at other parts than the masked parts, while giving no ion implantation damages to the masked parts, which act as regions for forming nuclei.

In the case of a film having an amorphous structure formed during the deposition of the film, the first ion implantation as mentioned above can be omitted.

In the foregoing procedures, two runs of ion implantation are carried out. By proper selection of mask materials and thickness, the projection range in the parts corresponding to the finely small regions can be positioned to the level near the middle of the film thickness, while the projection range at other parts can be positioned near the boundary of the amorphous film or polycrystalline film to the base substrate, and thus formation of finely small regions with a low degree of implantation damages and conversion of the polycrystalline film to an amorphous film can be carried out by one run of ion implantation.

The mask is preferably a mask of material capable of passing implanted ions therethrough, for example, of inorganic material such as silicon oxide, or the like.

The crystalline film obtained according to the present invention includes films of continued or discontinued crystals within the same flat or curved plane. That is, in the present invention the crystalline film includes an amorphous plane whose entire regions are crystallized or parts of whose regions are crystallized.

Now, a process for forming a crystalline semiconductor film according to the second aspect of the present invention will be explained below, referring to FIGS. 4, 5 and 6.

I. At first, explanation will be made on formation of an amorphous film 412 on a substrate 401.

(1) A substrate 401 can be composed of any material, so long as the material is suitable for a successive heat treatment step or a device formation step. For example, the substrate includes a silicon wafer, a guartz substrate, a glass substrate, or the like.

Figure 4A:
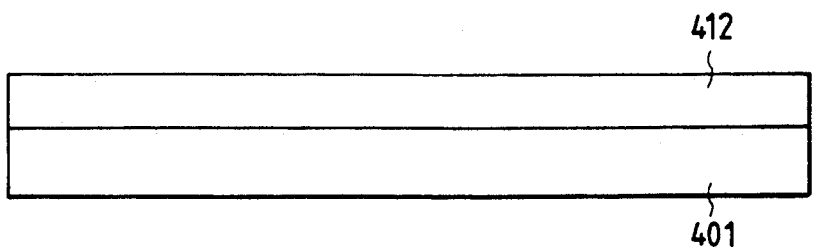
FIGS. 4A to 4E show process steps according to another embodiment of the present invention.

Then, amorphous film 412 is deposited on the substrate 401 by a vacuum vapor deposition with electron beam heating, a reduced pressure CVD method, a plasma CVD method, or by a method for turning a deposited polycrystalline into an amorphous film by implantaing ions of an element constituting the polycrystalline into the deposited polycrystalline film (FIG. 4A).

Figure 4B:
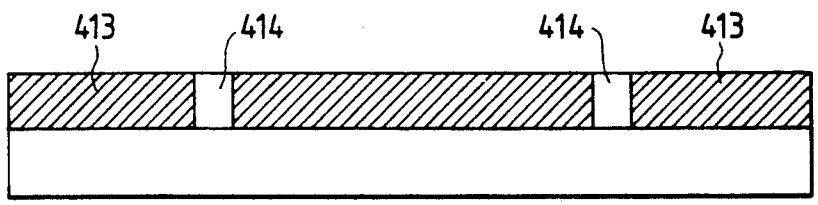

(2) Then, ions of an element constituting the amorphous film 412 are implanted into other regions 413 through the surfaces than the regions 414 where formation of nuclei is desired to take place in the amorphous film 412. The ion implantation can be carried out by masking the regions 414 with resists or the like by patterning masks for ion implantation or by masking according to any other procedure. The size of the regions 414 not subject to the ion implantation is large enough to form only one crystal by heat treatment. The size of regions 414 not subject to the ion implantation depends on the density of crystal nuclei formed by the heat treatment, and is preferably not more than 5 μm in diameter, more preferably not more than 2 μm in diameter. Thus it is preferable to control the density of crystal nuclei to obtain the preferable or more preferable size of regions 414 (FIG. 4B).

II. The heat treatment step will be explained below. The present inventors have found the following facts by experiments on the solid phase crystallization of amorphous silicon film.

1. An amorphous silicon film formed by implanting silicon ions into a polycrystalline silicon film having grain sizes of 10 Å to a few hundred Å formed by a reduced pressure CVD method or the like was annealed in a lamp anneal furnace for a long time.

Figure 6:
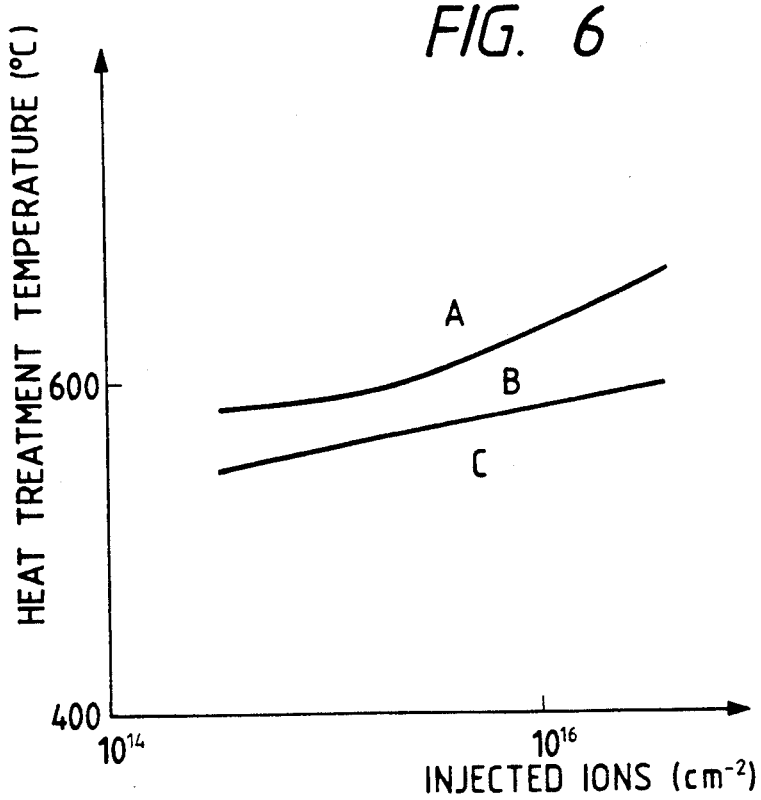
FIG. 6 is a diagram showing a relationship between a heat treatment temperature and a degree of crystallization of amorphous Si film in relation to an Si ion implantation dose.

FIG. 6 is a diagram showing a relationship between a heat treatment temperature and a degree of crystallization of an amorphous silicon film through a Si ion dose, obtained by the annealing. As is obvious from FIG. 6, crystal nuclei were generated at a higher temperature than the critical temperature of about 600° C. (Tc) and crystals grow at the crystal nuclei as growth points. In FIG. 6, a zone for such crystal growth is shown by zone A. When the temperature was lower than Tc, no crystals were formed at all even by heat treatment for 200 hours. The generation of crystals was observed by a transmission-type electron microscope. It was found that by providing crystals in the amorphous film in advance or by providing crystals acting as growth points for the solid phase crystal growth in contact with the amorphous film, the crystal growth proceeded as the crystals as growth points even in the zone at a lower temperature than Tc. Such a zone is shown as zone B in FIG. 6. When the temperature was lower than the temperature of zone B, the crystal growth no more proceeded. Such zone is shown by zone C in FIG. 6.

It seems that the foregoing phenomena are due to a difference between the activation energy of crystal nucleus growth and that of formation of crystal nuclei. That is, it seems that the activation energy of formation of crystal nuclei is somewhat higher than that of crystal nucleus growth.

Figure 7:
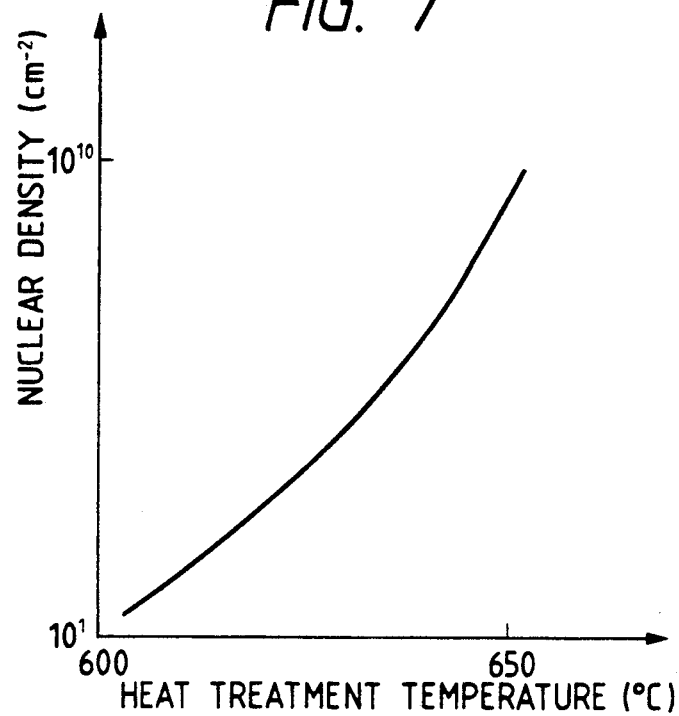
FIG. 7 is a diagram showing a relationship between a heat treatment temperature and a density of crystal nuclei formed in an amorphous film.

2. It was further found as a result of analysis based on the pictures obtained by a transmission-type electron microscope that the average grain size of crystallized films obtained by annealing at temperature within the zone A of FIG. 6 were decreased with increasing anneal temperature, as shown in FIG. 7. FIG. 7 shows a relationship between an anneal temperature and density of nuclei formed in the amorphous film. As is obvious from FIG. 7, the density of nuclei formed in the amorphous film is increased with increasing anneal temperature. This phenomena are based on the fact that the heat energy to be given to the amorphous film is increased with increasing anneal temperature and consequently a frequency to form crystal nuclei is increased.

Figure 8:
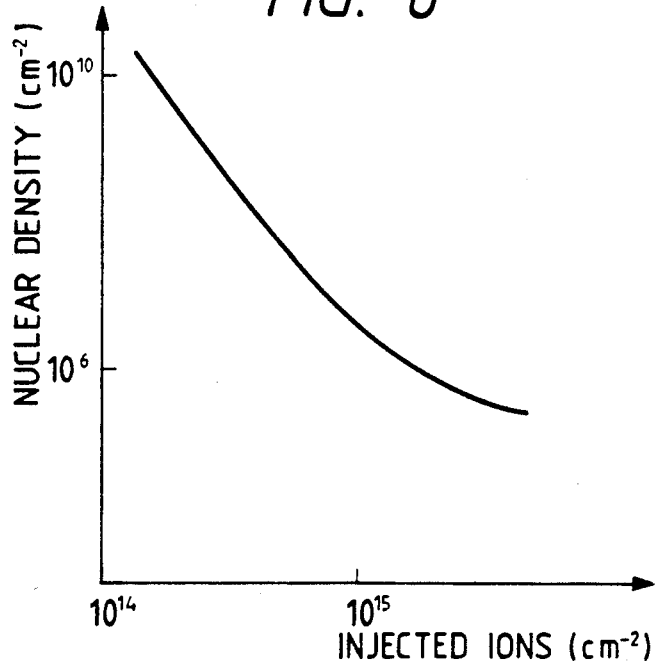
FIG. 8 is a diagram showing a relationship between an ion implantation dose and a density of crystal nuclei formed by heat treatment.

FIG. 8 shows a relationship between a density of crystal nuclei generated in an amorphous silicon film and an ion implantation dose to the polycrystalline silicon film by implanting ions into the polycrystalline silicon film, thereby making the polycrystalline silicon film amorphous and then by heat-treating the film. As is obvious from FIG. 8, the density of crystal nuclei is increased also with decreasing silicon ion implantation dose into the polycrystalline silicon film. When the polycrystalline film is made amorphous by the ion implantation, it seems that the degree of residence of long-distance order in the amorphous film depends on an ion implantation dose.

Figure 5:
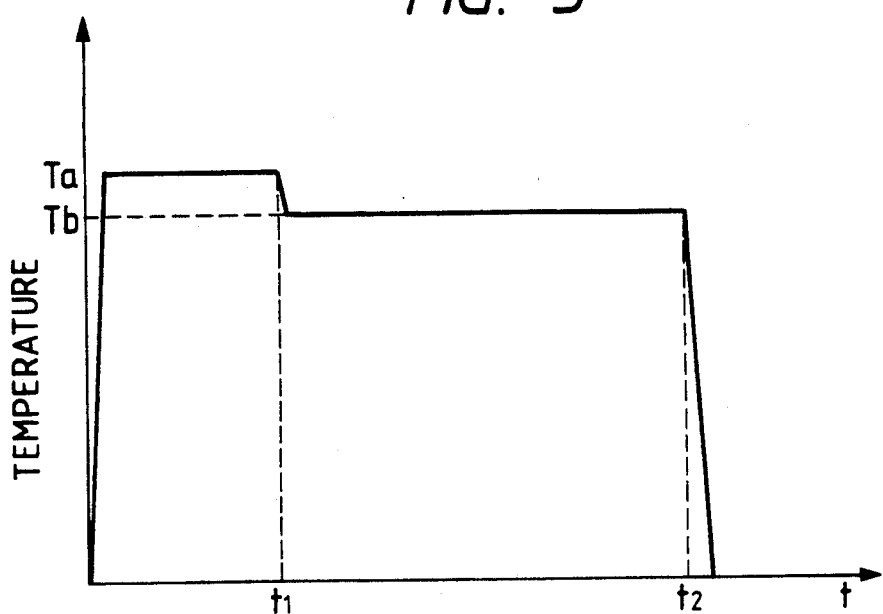
FIG. 5 shows formation steps by heat treatment according to the present invention.

On the basis of the foregoing findings 1 and 2, heat treatment is carried out as shown in FIG. 5.

Figure 4C:
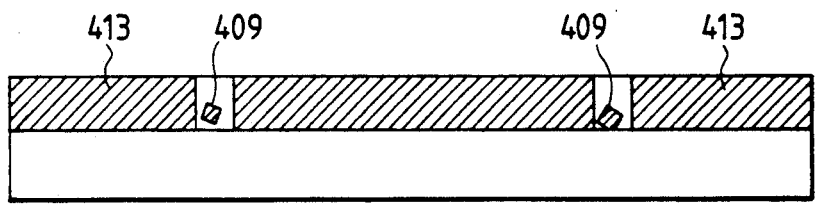

(1) In heat treatment up to the initial time $t_1$, a heat treatment temperature is set to Ta only for a predetermined time at the initial stage of crystallization. In FIG. 5, Ta is such a heat treatment temperature within the crystal generation and growth range for the regions not subject to the ion implantation and also within the range of zone B of FIG. 6 for the regions subject to the ion implantation. The existence of such a temperature Ta is obvious from FIGS. 6 and 8. By setting the heat treatment temperature in the above-mentioned manner, the regions where the formation of nuclei takes place are restricted to control the positions of crystal nuclei to be formed in the amorphous film (FIG. 4B). By controlling the heat treatment temperature or the ion implantation dose into the amorphous film, only one crystal nucleus 409 can be formed each in the desired regions. (FIG. 4C).

Ta is a temperature below the melting point of the amorphous film, at which crystal nuclei can be generated by heat treatment. For example, Ta is 400° to 700° C., preferably 500° to 700° C. in the case of a Si film. $t_1$ is the time required for forming only crystal nucleus each in the regions not subject to the ion implantation, and depends on conditions for forming an amorphous film, heat treatment temperature, etc. $t_1$ is preferebly the latent time till the generation of crystal nuclei plus about one to about 5 hours.

Figure 4D:
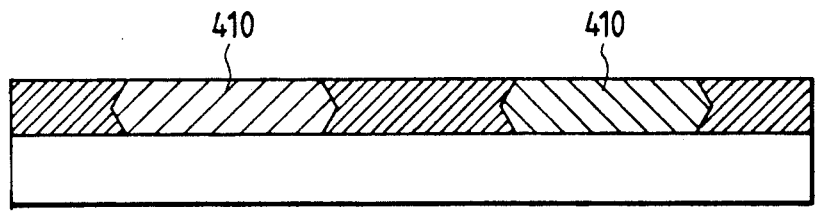

(2) The position-controlled crystal nuclei 409, formed till the time $t_1$ are further subjected to crystal growth after the time $t_1$. After the time $t_1$, heat treatment is carried out till the time $t_2$ the crystals 409 are grown to a desired grain size by setting the heat treatment temperature to a temperature Tb within the zone B of FIG. 6 and making the crystals 409 grow as the crystal nuclei growth points, so that no new crystal generation may take place in the amorphous film until the entire amorphous film is crystallized by the crystal growth from the crystal nuclei (FIG. 4D). When the crystal growth is continued until the adjacent crystals are brought into contact with each other, a crystal grain boundary 411 is formed along the line at the middle of the line connecting the two adjacent crystal nuclei as growth points for these crystals. Thus, the position of crystal grain boundary can be controlled thereby.

Figure 4E:
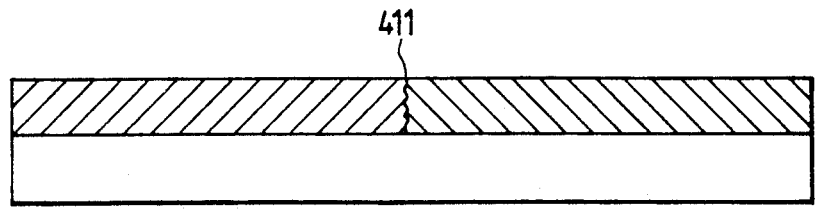

In this manner, groups of crystal grains with controlled position and grain size of crystal grains and controlled position of crystal grain boundary can be formed (FIG. 4E).

By arranging the regions 414 not subject to the ion implantation in a lattice point manner as shown in FIG. 4B and making crystal growth, single crystal grains are regularly arranged as shown in FIG. 4E and thus devices containing no crystal grain boundaries inside can be readily formed.

A process for forming a crystalline semiconductor film according to the first aspect of the present invention will be explained below, referring to Examples.

EXAMPLE 1

An amorphous Si film was deposited on a glass substrate containing $SiO_2$ as the main component to a thickness of 100 nm by a vacuum CVD method. $SiH_4$ was used as a source gas, the substrate temperature was 550° C. and the reaction pressure was 0.3 Torr.

Then, resist masks were patterned on the amorphous Si film by an ordinary lighography to leave resist masks, 1 μm in diameter, in two kinds of lattice point patterns at distances of 5 μm and 10 μm.

$Si^+$ ions were implanted onto the entire surface with the resist masks thereon at 70 key. The implantation dose was $3 \times 10^{15}$ cm$^{-2}$. By an implantation energy of 70 key, the projection range reached positions near the boundary of Si film having the thickness of 100 nm to $SiO_2$ glass as a base material, whereby the boundary ($Si/SiO_2$) in all the regions other than the resist-masked regions, 1 μm in diameter, were damaged. After removal of the resist masks, the film was heat treated in a nitrogen atmosphere at 630° C. for 80 hours. As a result of observation of the substrate by a transmission-type electron microscope the crystal grain boundaries were found substantially at distances of 5 μm and 10 μm, corresponding to the initial point pattern distances, and distribution of crystal grain sizes was within ±1 μm each from 5 pm and 10 pm on the average.

Similar effect was obtained by heat treatment in a hydrogen atmosphere in place of nitrogen atmosphere.

EXAMPLE 2

A polycrystalline Si film was deposited on a base substrate of glass plate to a film thickness of 100 nm by heat decomposition of $SiH_4$ by a vacuum chemical vapor deposition process. The substrate was at a temperature of 620° C. and a reaction pressure of 0.3 Torr. The grain size of the resulting polycrystalline Si film was as small as about 50 nm.

Then, $Si^+$ ion implantation was carried out twice. That is, at first, $Si^+$ ions were implanted into the entire surface of the polycrystalline Si film at a dose of $3 \times 10$ cm$^{-2}$ and an implantation energy of 40 keV without providing resist masks on the film. As already mentioned before, the ion implantation damages were continuous and the polycrystalline Si film was made amorphous. However, the projection range at 40 keV was positioned near the middle of the film thickness of 100 nm, and as a result there were no substantial damages to the positions near the boundary of the Si film to the $SiO_2$ base substrate.

Then, two kinds of resist masks, 1 μm in diameter, in lattice point patterns at distances of 5 μm and 10 μm on the amorphous Si film, as in Example 1, and the second Si+ ion implantation was carried out at 70 keV, whereby ion implantation damages took place near the boundary of the Si film to the base substrate by the second ion implantation. The second ion implantation dose was the same as the first ion implantation dose. After the removal of the resist masks, the film was heat treated in a nitrogen atmosphere at 620° C. for 100 hours. As a result, a polycrystalline Si film was obtained as in Example 1. The grain size of the polycrystalline Si film was 5 $\mu m \pm 1$ $\mu m$ and 10 $\mu m \pm 1$ $\mu m$ and the grain boundaries were arranged in the lattice pattern.

With the polycrystalline Si films having a film thickness of 100 nm obtained in Examples 1 and 2, a plurality of field effect transistors having a channel length of 3 $\mu m$ were prepared by an ordinary IC process and their characteristics were investigated. The electron mobility calculated by electrostatic characteristics of the transistors was $200 \pm 5$ cm/V.sec and the fluctuation in the threshould value was $\pm 0.2$ V. It was possible to arrange the boundaries not in the channel parts of the transistor, and thus it was possible to make the device characteristics have higher performance and narrow the distribution of the device characteristics.

EXAMPLE 3

An amorphous Ge film was vacuum vapor deposited on a base substrate composed of $SiO_2$ to a film thickness of 50 nm by an electron beam under a vacuum of $1 \times 10^{-6}$ Torr at a substrate temperature of room temperature. Resist masks were provided on the amorphous Ge film at portions of 1.5 $\mu m$ in diameter at 10 $\mu m$ intervals. Then, Ge ions were implanted at 130 keV on the entire surfaces of the masked parts and exposed parts on the amorphous Ge film at an ion implantation dose of $2 \times 10^{15}$ cm$^{-2}$. The ion implantation depth was about 50 nm from the surface and damages were given to the position near the boundary.

After removal of the resist masks, the film was heat treated in a nitrogen or hydrogen atmosphere at 380° C. for 50 hours, whereby single crystals were grown only in the masked finely small regions having no damages at the boundaries owing to no Ge+ ion implantations and further were made to extend to the amorphous Ge regions damaged at the boundaries by implanted Ge+ ions. The adjacent crystals impinge to each other at the middle between the adjacent crystal nucleus generation points to form a crystal grain boundaries there. As a result of an examination of the crystal structure by transmission-type electron microscope, it was found that the grain size of each single domain was 10 $\mu m \pm 1$ $\mu m$.

EXAMPLE 4

A polycrystalline Ge film was formed on a base substrate composed of $SiO_2$ to a Ge film thickness of 50 nm by heat decomposition of $GeH_4$ according to a vacuum CVD method at a base substrate temperature of 400° C. It was found by a transmission-type electron microscope that the resulting polycrystalline Ge had a grain size of about 100 nm.

Then, Ge+ ions were implanted into the polycrystalline Ge film at an implantation energy of 60 key and an ion implantation dose of $2 \times 10^{15}$ cm$^{-2}$ to make the entire film amorphous. The implantation depth at the implantation energy of 60 key was about 25 nm from the surface. At that time, no substantial ion implantation damages were given to the boundary of the Ge film to the $SiO_2$ underlayer material.

Then, resist masks of 1.2 $\mu m$ in diameter were provided on the amorphous Ge film at 15 $\mu m$ intervals, and then Ge+ ions were implanted into the film at an implantation energy of 130 key and an ion implantation dose of $2 \times 10^{15}$ cm$^{-2}$. At that time, the boundary of the Ge film to the $SiO_2$ underlayer material in the implanted regions was primarily damaged. After removal of the resist masks, the film was heat treated in a nitrogen atmosphere at 390° C. for 60 hours, whereby crystallization took place only at the finely small regions not subject to damages at the boundary of the Ge film to the $SiO_2$ underlayer material, and crystals of single domain grew. The crystals continuously grew and extended to the regions with damages at the boundary, while maintaining their crystal structure, and finally adjacent crystals impinged on one another to form boundaries at the middle between the adjacent finely small regions with the undamaged boundary.

As the result of observation of the substrate by a transmission-type electron microscope, it was found that a polycrystalline film with uniform grain sizes of 15 $\mu m \pm \mu m$ was formed.

EXAMPLE 5

A polycrystalline Si film was deposited on a molten guartz substrate as an underlayer material to a thickness of 100 nm under the following conditions by a low pressure CVD method:
Gas used: $SiH_4$
Gas flow rate: 50 sccm
Pressure: 0.3 Torr
Substrate temperature: 620° C.

Then, an amorphous $SiO_2$ film was deposited on the polycrystalline Si film to a thickness of about 30 nm by an atmospheric pressure CVD method and then subjected to pattern by an ordinary photolithographic method to leave the $SiO_2$ regions, 1 $\mu m \times 1$ $\mu m$ in square, in a lattice dot state at distances of 10 $\mu m$.

Then, Si+ ions accelerated to an energy of 70 keV were implanted onto entire surface of the substrate at an ion implantation dose of $5 \times 10^{15}$ cm$^{-2}$. By the ion implantation, the entire regions of polycrystalline Si film including the $SiO_2$ film-masked regions were made amorphous. In this case, the projection range of Si+ ions in the Si film was 99.7 nm, and thus the largest amount of implanted Si+ ions was distributed at positions near the boundary to be molten quartz substrate in the $SiO_2$ film-unmasked regions in the Si film, and thus regions not subjected to the nucleus formation were formed.

On the other head, in the $SiO_2$ film-masked regions, 1 $\mu m \times 1$ $\mu m$ in square, not only the maximum distribution (projection range) of the implanted Si ions was retained in the Si film, but also their absolute amount was small, and thus the $SiO_2$ film-masked regions turned to regions subject to the nucleus formation.

Then, the $SiO_2$ thin film masks dotwise provided on the surface of Si films were removed by etching with water-diluted HF, and then the substrate was annealed in a nitrogen atmosphere while keeping the substrate temperature at 600° C. About 10 hours after the start of annealing, crystal nuclei started to generate in the Si ion-implanted, $SiO_2$ film-masked regions, 1 $\mu m \times 1$ $\mu m$ in square. At that time, no nucleus formation took place in the Si ion-implanted, $SiO_2$ film-unmasked regions. By further continuing the annealing, the crystal nuclei formed in the regions, 1 $\mu m \times 1$ $\mu m$ in square, laterally grew over the regions to form crystal grains of larger grain size. By continuous annealing for about 100 hours, the crystal grains were brought in contact with crystal grains grown from the about 10 μm-distant adjacent regions to form crystal grain boundaries therebetween, and the amorphous Si film was crystallized substantially, throughout the entire regions. As a result, a polycrystalline film composed of crystal grains having an average grain size of 10 μm and crystal grain boundaries distributed in a lattice at distances of about 10 μm was obtained.

EXAMPLE 6

An amorphous Si film was deposited on a quartz substrate as an underlayer material to a thickness of 100 nm by an electron beam vapor deposition method in an ultra high vacuum under the following conditions:

Attainable vacuum: $1 \times 10^{-10}$ Torr
Vacuum during the vapor deposition: $5 \times 10^{-10}$ Torr
Substrate temperature: 150° C.
Deposition rate: up to 100 nm/hr Resist masks were patterned on the amorphous Si film square, thereon in a lattice dot state at distances of 10 μm. Then, Si+ ions accelerated to an energy of 70 keV were implanted into the entire substrate at an ion implantation dose of $1 \times 10^{15} cm^{-2}$. In this case, the projection range of Si ion was 99.7 nm in the Si film and thus a largest among of Si ions was distributed in the resist-unmasked regions at the positions near the boundary of the amorphous Si film to the quarts substrate and many ion implantation damages were given to the boundary.

After removal of the resist masks, the substrate was heat treated in a nitrogen atmosphere at a substrate temperature of 590° C. About 15 hours after the start of the heat treatment, crystal nuclei started to generate in the regions not subject to the Si ion implantation, 1 μm × 1 μm in square. At that time, no nucleus formation took place at all in the resist-unmasked regions subject to the Si ion implantation. By further continuing the annealing, the crystal nuclei formed in the regions, 1 μm × 1 μm in square, laterally grew over the ranges to form arborescent crystal grains having a larger having a larger grain size. By continuous annealing for about 120 hours, the crystal grains were brought into contact with the crystal grains grown from the about 10 μm-distant adjacent regions to form crystal grain boundaries therebetween, and the amorphous Si film was crystallized substantially throughout the entire regions. As a result, a polycrystalline film composed of crystal grains having an average grain size of 10 μm and crystal grain boundaries distributed in a lattice pattern at distances of about 10 μm was obtained.

EXAMPLE 7

An amorphhous Si film was deposited on the surface of a glass substrate as an base material to a thickness of 100 nm by a DC magnetron sputtering method under the following conditions:

Attainable vacuum: $5 \times 10^{-7}$ Torr
Vacuum during the vapor deposition: $2 \times 10^{-3}$ Torr
Substrate temperature 20° C.
Deposition rate: up to 200 nm/hr Then, resist masks were patterned on the amorphous Si film by an ordinary photolithography method to leave regions, 2 μm × 2 μm in square, in a lattice dot pattern at distances of 10 μm. Then Si+ ions accelerated to an energy of 60 keV were implanted onto the entire surface of the substrate at an ion implantation does of $5 \times 10^{15} cm^{-2}$.

In this case, the Si ion projection range was 84.5 nm in the Si film, and thus the largest amount of Si ions was distributed in the resist-unmasked regions at positions near the boundary of the amorphous Si film to the molten quartz substrate to form regions not subject to the nucleus formation.

On the other hand, in the resist-masked regions 1 μm × 1 μm in square, the implanted Si ions failed to reach the amorphous Si film and the resist-masked turned to regions subject to the nucleus formation.

After removal of the resist masks dotwise present on the surface, the substrate was annealed in a nitrogen atmosphere at a substrate temperature of 620° C. After about 15 hours from the start of annealing, crystal nuclei started to form in the resist-masked, regions not subject to the Si ion implantation, 2 μm × 2 μm in square. At that time, no nucleus formation took place in the resist-unmasked regions subject to the Si ion implantation. By further continuing the annealing, the crystal nuclei formed in the regions, 2 μm × 2 μm in square, laterally grew over the regions to form arborescent crystal grains having a large grain size. By continuous annealing for about 120 hours, the crystal grains were brought into contact with the crystal grain grown from 10 μm-distant adjacent regions to form crystal grain boundaries therebetween, and the amorphous Si film was crystallized substantially throughout the entire regions. As a result, a thin film crystal composed of crystal grains having an average grain size of 10 μm and crystal grain boundaries distributed in a lattice pattern at distances of about 10 μm was obtained.

In each of Examples 1 to 6, one run of heat treatment was carried out at a constant heat treatment temperature, but a plurality of runs of the heat treatment can be carried out at different heat treatment temperature.

A process for forming a crystalline semiconductor film according to the second aspect of the present invention is explained below, referring to Examples.

EXAMPLE 8

At first, an amorphous silicon film was deposited on the surface of a quartz substrate to a thickness of 100 nm at 550° C. by a reduced pressure CVD method. At that time, the flow rate of SiH4 gas was 20 sccm, the reaction pressure was 0.3 Torr, and the substrate temperature was 550° C.

Then, resist masks were provided on the surface of the amorphous silicon film so as to have a lattice dot pattern to make dots 1 μm × 1 μm in square, at distances of 8 pm by photolithography in an ordinary semiconductor process.

Si+ ions were implanted only into the resist-unmasked regions at an implantation energy of 70 keV and a dose of $5 \times 10^{15}/cm^{-2}$. Then, the resist masks were removed.

The substrate was then heat treated in a nitrogen atmosphere at 630° C. for 15 hours in a lamp anneal furnace. As the result of observation of the substrate by a transmission-type electron microscope, only one crystal was found in each of the regions not subject to the ion implantation in the amorphous silicon film.

Successive to the heat treatment, the substrate was further heat treated in a nitrogen atmosphere at 580° C. for 100 hours. As the result of observation of the substrate by a transmission-type electron microscope, it was found that in the amorphous silicon film crystals underwent solid phase growth at the Si crystals as growth points and the substrate surface was covered with crystal grains having grain sizes of about 8 μm, and no amorphous regions were observed A plurality of n-MOS transistors, 3 μm in channel length and 5 μm wide, were formed on the thus formed silicon polycrystalline film by an ordinary semiconductor process, so that the channel part could be contained in one crystal grain. The source drain regions were formed by phosphorus implantation. Among them, the mobility (electric field effect mobility) of 100 transistors in the triode tube zone was 190 cm$^2$/V.sec on the average, and the fluctuation in the threshold voltage was about ±320 mV from the average value. That is, the mobility was higher than a mobility of 110 cm$^2$/V.sec in the MOS transistors (channel length: 10 μm) on a polycrystalline silicon formed by conventional solid phase recrystallization at a single temperature and the fluctuation in the threshold value was lower than ±500 mV.

As obvious from the foregoing, the size of crystal grains constituting a polycrystalline film was made uniform, and devices containing no grain boundaries could be made by controlling the positions of crystal grain boundaries. That is, devices with distinguished characteristics could be formed with less differences between the devices.

EXAMPLE 9

At first, a polycrystalline film was deposited on a glass substrate to a thickness of about 100 nm by a reduced pressure CVD method using SiH$_4$. At that time, the flow rate of SiH$_4$ was 20 sccm, the reaction pressure was 0.3 Torr, and the substrate temparature was 620° C.

Then, Si+ ions were implanted on the polycrystalline silicon film at a implantation energy of 25 key and an ion plantation dose of $5 \times 10^{15}$cm$^{-2}$ to make the polycrystalline silicon film amorphous.

Then, resist masks were provided on the surface of the thus formed amorphous silicon film by photolithography in an ordinary semiconductor process to make the resist masks 2 μm×2 μm in square in a lattice dot pattern at the distances of 10 μm.

Again, Si+ ions were implanted only into the unmasked regions at an implantation energy of 70 key and an ion implantation dose of $5 \times 10^{15}$cm$^{-2}$. Then, the resist masks were removed.

Then, the substrate was heat treated in a nitrogen atmosphere at 655° C. for 15 hours. As a result of observation of the substrate by an electron microscope, a single crystal was found in each of the regions not subject to the ion implantation in the amorphous silicon thin film.

Successive to the heat treatment, the substrate was heat treated in a nitrogen atmosphere at 580° C. for 120 hours. As a result of observation of the substrate by a transmission-type electron microscope, it was found that in the amorphous silicon film crystals underwent solid phase growth at the Si crystal nuclei as growth points. The substrate surface was covered with crystal grains having grain sizes of about 10 μm, and no amorphous regions were observed.

A plurality of n-MOS transistors, 3 μm in channel length and 5 μm wide, were formed on the thus formed silicon polycrystalline film by an ordinary semiconductor process, so that the channel part could be contained in the single crystal grain. The source drain regions were formed by phosphorus implantation. Among them, the mobility of 100 transistors in the triode tube zone was 200 cm$^2$/V.sec, and the fluctuation in the threshold voltage was about ±310 mV from the average value. That is, the mobility was higher than a mobility of 110 cm$^2$/V.sec in the MOS transistors (channel length:10 μm) on a polycrystalline silicon formed by conventional solid phase recrystallization at a single temperature and the fluctuation in the threshold value was lower than ±500 mV. That is because the average grain size of grains constituting the crystalline film became larger and the crystalline film could be formed by controlling the positions of grain boundaries.

As obvious from the foregoing, the present process for forming a crystalline semiconductor film has the following effects.

According to the present invention, a polycrystalline semiconductor film having a desired grain size with controlled positions of crystal grain boundaries can be obtained. When devices are formed with the present crystalline semiconductor film, an integrated circuit with distinguished characteristics and without fluctuations in the characteristics even if considerably increased number of devices can be formed.

Furthermore, according to the present invention, a flat crystalline semiconductor film having a larger grain size can be formed without requiring a polishing step, etc., and thus a process for forming a device can be considerably simplified.

Still furthermore, impurities that contaminate a polycrystalline semiconductor film can be suppressed to a maximum, and thus devices with a very high performance can be formed with the present crystalline semiconductor film.

What is claimed is:

1. A process for forming a polycrystalline semiconductor film by crystallization through solid phase growth of an amorphous semiconductor film on a base material, which comprises:
    (i) selectively implanting ions of an element constituting the amorphous semiconductor film into the amorphous semiconductor film except at a fine region having a mask provided thereon and corresponding to an area not more than 5 μm in diameter therein,
    (ii) heat-treating the amorphous semiconductor film at a temperature not higher than the melting point of the amorphous semiconductor film, thereby generating a crystal nucleus in the fine region, and
    (iii) making a crystal grow at the crystal nucleus as a growth point.

2. A process for forming a polycrystalline semiconductor film by crystallization through solid phase growth of an amorphous semiconductor film on a base material, which comprises:
    (i) selectively implanting ions of an element constituting the amorphous semiconductor film into the amorphous semiconductor film such that a fine region having a mask provided thereon, having an area not more than 5 μm in diameter and having a lower degree of implantation damage than that of the other remaining regions is created at the boundary between the amorphous semiconductor film and the base material,
    (ii) heat-treating the amorphous semiconductor film at a temperature not higher than the melting point of the amorphous semiconductor film, thereby generating only a single crystal-nucleus from the fine region, and (iii) making a crystal grow at the crystal nucleus as a growth point.

3. A process according to claim 2, wherein the amorphous semiconductor film is a semiconductor film having an amorphous structure formed during the deposition of the film or a semiconductor film made amorphous by ion implantation of a polycrystalline semiconductor film.

4. A process according to claim 2, wherein the amorphous semiconductor film is a semiconductor film made amorphous form a polycrystalline semiconductor film by ion implantation such that the projection range of the ion implantation reaches positions near the middle of the film-thickness of the polycrystalline semiconductor film.

5. A process according to claim 2, wherein the fine region is formed by effecting ion implantation into the amorphous semiconductor film under provision of a resist-mask on the amorphous semiconductor film so that the projection range of the ion implantation reaches positions near the boundary of the amorphous semiconductor film to the base material, thereby making the degree of ion implantation damage in the fine region lower than in the unmasked ion-implanted region.

6. A process according to claim 3, wherein the fine region is formed by ion implantation into %he polycrystalline semiconductor film under provision of a resist mask in the region corresponding to the fine region on the polycrystalline semiconductor film, the resist mask being capable of shortening the projection range, so that the projection range reaches positions near the boundary of-the polycrystalline semiconductor film to the-base material in other regions than the resist-masked region, thereby effecting by one run the conversion of the polycrystalline semiconductor film to amorphous state and the formation of the fine region lower in a degree of ion implantation damage than in the region except the masked region.

7. A process according to any one of claims 1 and 2 wherein the heat treatment is carried out in a plurality of runs at different temperatures.

8. A process for forming a polycrystalline semiconductor film, which comprises:
 (i) providing a region having a mask provided thereon and small enough to form only a single crystal-nucleus by heat treatment at a desired position of an amorphous semiconductor film provided on a base material;
 (ii) selectively implanting ions of the element constituting the amorphous semiconductor film into the amorphous semiconductor film in areas not being provided with the mask;
 (iii) carrying out a first heat treatment of the amorphous semiconductor film at a first temperature not higher than the melting point of the amorphous semiconductor film, thereby forming only a single crystal-nucleus in the small region; and
 (iv) carrying out a second heat treatment of the amorphous semiconductor film at a second temperature lower than the first temperature, thereby making a crystal grow at the nucleus as a growth point.

9. A process according to claim 8, wherein the amorphous semiconductor film is an amorphous semiconductor film formed by implanting ions of an element constituting a polycrystalline semiconductor film into the polycrystalline semiconductor film thereby making the polycrystalline semiconductor film amorphous or by deposition by a gas phase process.

10. A process according to claim 8, wherein the fine region is a circular area having a diameter of not more than 5 μm.

* * * * *

UNITED STATES PATENT AND TRADEMARK OFFICE
CERTIFICATE OF CORRECTION

PATENT NO. : 5,290,712
DATED : March 1, 1994
INVENTOR(S) : NOBUHIKO SATO, ET AL.

It is certified that error appears in the above-identified patent and that said Letters Patent is hereby corrected as shown below:

ON TITLE PAGE

In [56] References Cited, under FOREIGN PATENT DOCUMENTS:
"63-253616 10/1980 Japan ." should read
--63-253616 10/1988 Japan .--.

COLUMN 1

Line 28, "5 pm" should read --5 µm--.

COLUMN 2

Figure 9A:
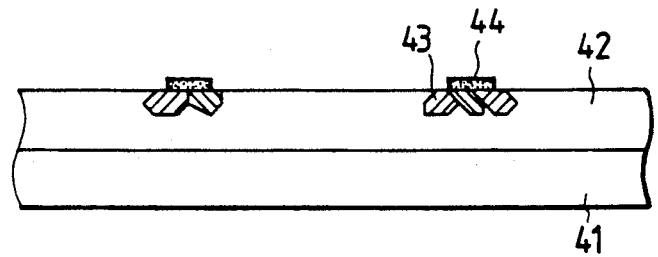
FIGS. 9A to 9B and 10 show process steps for forming a crystalline semiconductor film according to prior art.
Figure 9B:
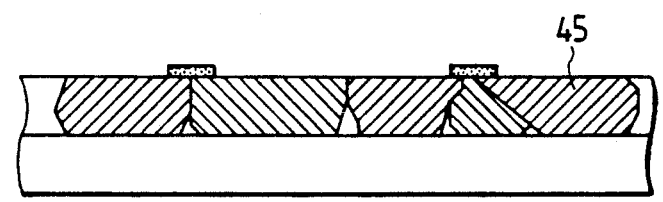
Figure 10:
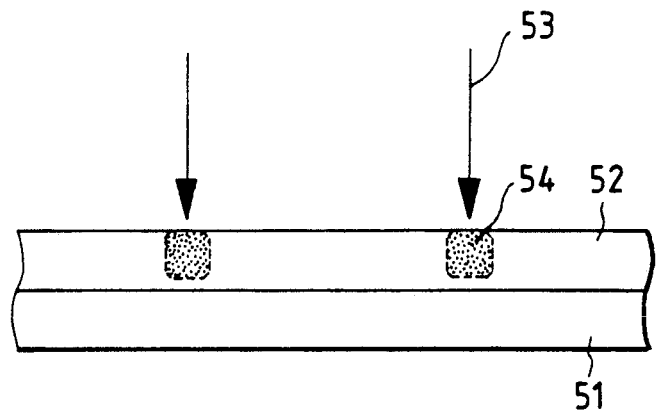

Line 16, "FIG. 9B" should read --FIG. 9B,--.
Line 43, "other" should read --another--.

COLUMN 3

Line 52, "an" should read --a--.

COLUMN 4

Line 59, "damages," should read --damage,--.

COLUMN 5

Line 33, "40 key" should read --40 keV-- and
"80 key." should read --80 keV.--.
Line 44, "40 key" should read --40keV-- and
"70 key" should read --70keV--.
Line 46, "40 key" should read --40keV-- and
"70 key" should read --70keV--.

UNITED STATES PATENT AND TRADEMARK OFFICE
CERTIFICATE OF CORRECTION

PATENT NO. : 5,290,712
DATED : March 1, 1994
INVENTOR(S) : NOBUHIKO SATO, ET AL.

It is certified that error appears in the above-identified patent and that said Letters Patent is hereby corrected as shown below:

COLUMN 6

Line 51, "is" should read --in-- and "preferebly" should read --preferably--.

COLUMN 8

Line 2, "guartz" should read --quartz--.

COLUMN 9

Line 7, "This" should read --These--.

COLUMN 10

Line 24, "lighography" should read --lithography--.
Line 28, "70 key." should read --70 keV.--.
Line 30, "70 key," should read --70 keV,--.
Line 42, "5 pm" should read --5 µm-- and "10 pm" should read --10 µm--.
Line 56, "3x10" should read --$3 \times 10^{15}$--.

COLUMN 11

Line 19, "threshould" should read --threshold--.
Line 62, "60 key" should read --60 keV--.
Line 65, "60 key" should read --60 keV--.

COLUMN 12

Line 4, "130 key" should read --130 keV--.
Line 22, "µm±µm" should read --µm±2 µm--.

UNITED STATES PATENT AND TRADEMARK OFFICE
CERTIFICATE OF CORRECTION

PATENT NO. : 5,290,712
DATED : March 1, 1994
INVENTOR(S) : NOBUHIKO SATO, ET AL.

Page 3 of 4

It is certified that error appears in the above-identified patent and that said Letters Patent is hereby corrected as shown below:

COLUMN 12

Line 26, "guartz" should read --quartz--.
Line 40, "entire" should read --the entire--.
Line 51, "head," should read --hand,--.

COLUMN 13

Line 27, "Si ion" should read --$Si^+$ ion--.
Line 28, "among" should read --amount-- and "Si ions" should read --$Si^+$ ions--.
Line 30, "quarts" should read --quartz--.
Line 37, "Si ion" should read --$Si^+$ ion--.
Line 40, "Si ion" should read --$Si^+$ ion--.
Line 43, "having a" (second occurrence) should be deleted.
Line 44, "larger" should be deleted.
Line 56, "amorphhous" should read --amorphous--.
Line 57, "an" should read --a--.
Line 61, "temperature" should read --temperature:--.

COLUMN 14

Line 1, "does" should read --dose--.
Line 4, "Si ions" should read --$Si^+$ ions--.
Line 10, "Si ions" should read --$Si^+$ ions--.
Line 17, "resist-masked," should read --resist-masked--.
Line 20, "Si ion" should read --$Si^+$ ion--.
Line 34, "6," should read --7,--.
Line 37, "temperature." should read --temperatures.--.
Line 52, "8 pm" should read --8 µm--.

UNITED STATES PATENT AND TRADEMARK OFFICE
CERTIFICATE OF CORRECTION

PATENT NO. : 5,290,712
DATED : March 1, 1994
INVENTOR(S) : NOBUHIKO SATO, ET AL.

It is certified that error appears in the above-identified patent and that said Letters Patent is hereby corrected as shown below:

COLUMN 15

Line 4, "observed" should read --observed.--.
Line 33, "temparature" should read --temperature--.
Line 35, "a" should read --an-- and
"25 key" should read --25 keV--.
Line 44, "70 key" should read --70 keV--.
Line 54, "atomosphere" should read --atmosphere--.

COLUMN 17

Line 14, "film-thickness" should read --film thickness--.
Line 26, "%he" should read --the--.
Line 32, "of-the" should read --of the--.
Line 33, "the-base" should read --the base--.

Signed and Sealed this

Twentieth Day of September, 1994

Attest:

BRUCE LEHMAN

Attesting Officer       Commissioner of Patents and Trademarks